United States Patent
Soyano

(10) Patent No.: US 9,576,913 B2
(45) Date of Patent: Feb. 21, 2017

(54) SEMICONDUCTOR DEVICE AND MANUFACTURING METHOD OF SEMICONDUCTOR DEVICE

(71) Applicant: FUJI ELECTRIC CO., LTD., Kawasaki-shi (JP)

(72) Inventor: Shin Soyano, Shiojiri (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 47 days.

(21) Appl. No.: 14/276,665

(22) Filed: May 13, 2014

(65) Prior Publication Data

US 2014/0246768 A1 Sep. 4, 2014

Related U.S. Application Data

(63) Continuation of application No. PCT/JP2012/076452, filed on Oct. 12, 2012.

(30) Foreign Application Priority Data

Dec. 8, 2011 (JP) .................................. 2011-269190

(51) Int. Cl.
*H01L 23/40* (2006.01)
*H01L 23/00* (2006.01)
(Continued)

(52) U.S. Cl.
CPC ............. *H01L 23/564* (2013.01); *H01L 23/02* (2013.01); *H01L 23/36* (2013.01);
(Continued)

(58) Field of Classification Search
CPC ........ H01L 23/564; H01L 23/50; H01L 23/02; H01L 25/162; H01L 23/36; H01L 23/4006; H01L 2924/1305; H01L 2924/30107;H01L 2924/3025; H01L 2924/13055; H01L 2924/13091; H01L 2924/19107; H05K 13/00; H05K 7/1432; H02M 7/003; Y10T 29/41
See application file for complete search history.

(56) References Cited

U.S. PATENT DOCUMENTS

| 4,574,470 | A | * | 3/1986 | Burt | ................... | H01L 23/4827 228/123.1 |
| 7,417,861 | B2 | * | 8/2008 | Kikuchi | ................ | H01L 25/162 257/E23.105 |

(Continued)

FOREIGN PATENT DOCUMENTS

| DE | 102009017621 B3 | 8/2010 |
| EP | 2242102 A1 | 10/2010 |

(Continued)

OTHER PUBLICATIONS

Japanese Office Action issued in Japanese counterpart application No. JP2013-548139, dated Sep. 1, 2015. .English translation provided.

(Continued)

*Primary Examiner* — Jarrett Stark
(74) *Attorney, Agent, or Firm* — Rossi, Kimms & McDowell LLP

(57) ABSTRACT

A semiconductor device that improves noise performance includes a circuit substrate, an enclosing case, and a metal part. A control circuit is mounted on the front surface of the circuit substrate. The enclosing case is a resin case in which semiconductor elements are installed. The metal part, included inside the enclosing case, includes a first mounting portion, a second mounting portion, and a bus bar. The first mounting portion mounts the circuit substrate on the enclosing case, and is connected to a ground pattern of the circuit substrate when mounting. The second mounting portion mounts an external instrument on the enclosing case, and is (Continued)

grounded when mounting. The bus bar connects the first mounting portion and second mounting portion.

13 Claims, 9 Drawing Sheets

(51) Int. Cl.
    *H02M 7/00*     (2006.01)
    *H01L 23/36*     (2006.01)
    *H05K 7/14*     (2006.01)
    *H01L 25/16*     (2006.01)
    *H01L 23/02*     (2006.01)
    *H01L 23/50*     (2006.01)
    *H05K 13/00*     (2006.01)
    *H01L 23/049*     (2006.01)
    *H01L 23/373*     (2006.01)
    *H01L 23/473*     (2006.01)

(52) U.S. Cl.
    CPC .......... *H01L 23/4006* (2013.01); *H01L 23/50* (2013.01); *H01L 25/162* (2013.01); *H02M 7/003* (2013.01); *H05K 7/1432* (2013.01); *H05K 13/00* (2013.01); *H01L 23/049* (2013.01); *H01L 23/3735* (2013.01); *H01L 23/473* (2013.01); *H01L 2224/48091* (2013.01); *H01L 2224/48137* (2013.01); *H01L 2924/1305* (2013.01); *H01L 2924/13055* (2013.01); *H01L 2924/13091* (2013.01); *H01L 2924/19107* (2013.01); *H01L 2924/3025* (2013.01); *H01L 2924/30107* (2013.01); *Y10T 29/41* (2015.01)

(56) References Cited

U.S. PATENT DOCUMENTS

| | | | |
|---|---|---|---|
| 8,164,904 B2* | 4/2012 | Matz | ............... H01L 25/0657 |
| | | | 174/252 |
| 2001/0012212 A1 | 8/2001 | Ikeda | |
| 2002/0024120 A1 | 2/2002 | Yoshimatsu et al. | |
| 2003/0137813 A1* | 7/2003 | Onizuka | ............... H05K 1/0263 |
| | | | 361/777 |
| 2003/0151128 A1 | 8/2003 | Kawaguchi | |
| 2004/0001319 A1* | 1/2004 | Kawakita | ............. H05K 1/0263 |
| | | | 361/715 |
| 2004/0095730 A1 | 5/2004 | Youm et al. | |
| 2005/0051874 A1 | 3/2005 | Ushijima | |
| 2012/0074542 A1 | 3/2012 | Soyano | |

FOREIGN PATENT DOCUMENTS

| | | |
|---|---|---|
| JP | 08-162572 A | 6/1996 |
| JP | 08-293578 A | 11/1996 |
| JP | 2001-036003 A | 7/1999 |
| JP | 2001-211663 A | 8/2001 |
| JP | 2002076257 A | 3/2002 |
| JP | 2005-085840 A | 3/2005 |
| JP | 2006140317 A | 6/2006 |
| JP | 2011216619 A | 10/2011 |
| WO | 2010/150471 A1 | 12/2010 |

OTHER PUBLICATIONS

Extended European Search Report issued in European counterpart application No. EP12855732.9, dated Sep. 8, 2015.
International Search Report issued in PCT/JP2012/076452, Mailing date Dec. 25, 2012. Please note, references cited in ISR were previously cited in an IDS filed May 13, 2014. English Translation provided.

\* cited by examiner

SEMICONDUCTOR DEVICE AND MANUFACTURING METHOD OF SEMICONDUCTOR DEVICE

BACKGROUND OF THE INVENTION

A. Field of the Invention

The present invention relates to a semiconductor device having semiconductor elements such as power semiconductor elements (IBGTs: Insulated Gate Bipolar Transistors), and to a semiconductor device manufacturing method which manufactures the semiconductor device.

B. Description of the Related Art

In recent years, electronic equipment has had an increase in speed, and a reduction in size and a reduction in power consumption have progressed. This kind of situation has a harsh tendency from the standpoint of the noiseproof property of electronic equipment against exogenous noise.

Also, the sources of generation of exogenous noise in mobile terminals, FM (Frequency Modulation) and AM (Amplitude Modulation) radios, and the like, are steadily increasing, and the noiseproof property of electronic equipment, in addition to a heretofore known disturbing noise removal, is strongly required.

Meanwhile, a power module called an IPM (Intelligent Power Module) has been developed. The IPM is a power module on which are mounted the drive circuit and control circuit, formed of power control power MOSFETs (Metal Oxide Semiconductor Field Effect Transistors), IGBTs, or the like, of a power device. The IPM is used in a wide range of fields as being useful for a reduction in size and weight, a reduction in development cost, a reduction in development time, and the like, of the device.

In order to take measures to protect the IPM against noise, particularly, as a vehicle-mounted IPM, or the like, is exposed to a harsh usage environment, it is important to take tough anti-noise measures of a heretofore known level or higher.

As a heretofore known technology, there is proposed a semiconductor device wherein an adhesive is interposed in a gap which is formed between an opening shouldered surface and a heat dissipation base plate by an end face of a protruding metal cylindrical collar coming into abutment with the heat dissipation base plate (PTL 1).

Also, there is proposed a semiconductor device including a columnar block with an upper portion thereof protruding from the upper surface of a resin case, wherein an external part is supported by a screw seat, and fixed to the screw seat by a fastening screw (PTL 2).

CITATION LIST

PTL 1: Japanese Patent No. 3196540
PTL 2: Japanese Patent No. 3750427

SUMMARY OF THE INVENTION

As a heretofore known measure to improve the noiseproof property, a pattern design for anti-noise measures has been carried out, or a bypass capacitor has been added. Furthermore, measures, such as blocking out radiation noise, or preventing radiation noise from being released to the exterior, by adding a shield plate, have been taken.

However, as a review of circuit configurations is needed when carrying out the pattern design for anti-noise measures, there has been a problem that an increase in the number of man-hours for development occurs.

Also, when adding a noise suppression part, such as a bypass capacitor or a shield plate, there has been a problem that an increase in mounting/circuit size and cost occurs.

The invention, having been contrived bearing in mind these kinds of points, provides a semiconductor device wherein the need for a review of circuit configurations or an increase of parts to be added afterwards is eliminated, thus improving noiseproof performance.

The invention also provides a semiconductor device manufacturing method wherein the need for a review of circuit configurations or an increase of parts to be added afterwards is eliminated, thus improving noiseproof performance.

In order to solve the heretofore described problems, a semiconductor device is provided. The semiconductor device includes an enclosing case in which semiconductor elements are installed; a circuit substrate on which a control circuit is mounted; and a metal part.

Also, the metal part includes a first mounting portion, a second mounting portion, and a bus bar. The first mounting portion mounts the circuit substrate on the enclosing case and is connected to a ground pattern of the circuit substrate when mounting. The second mounting portion mounts an external instrument on the enclosing case and is grounded when mounting. The bus bar connects the first mounting portion and second mounting portion.

The semiconductor device is configured including the metal part including the first mounting portion which mounts the circuit substrate on the enclosing case and is connected to the ground pattern of the circuit substrate, the second mounting portion which mounts the external instrument on the enclosing case and is grounded, and the bus bar which connects the first and second mounting portions to each other. By so doing, it is possible to eliminate the need for a review of circuit configurations or an increase of parts to be added afterwards, and thus improve noiseproof performance.

The semiconductor device manufacturing method is such that when the circuit substrate is fastened and fixed by a screw to a metal columnar support provided in the enclosing case, the ground pattern of the circuit substrate is connected to the metal columnar support. Also, when the external instrument is fastened and fixed by a screw to a ring portion provided in the enclosing case, a protruding portion of the screw which protrudes outside from the enclosing case is grounded. Further, the metal columnar support and ring portion are connected by a metal bus bar, thus manufacturing the semiconductor device. By so doing, it is possible to eliminate the need for a review of circuit configurations and an increase of parts to be added afterwards, and thus improve noiseproof performance.

The heretofore described and other objects, features, and advantages of the invention will be clarified by the following description relating to the attached drawings representing a preferred embodiment as an example of the invention.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
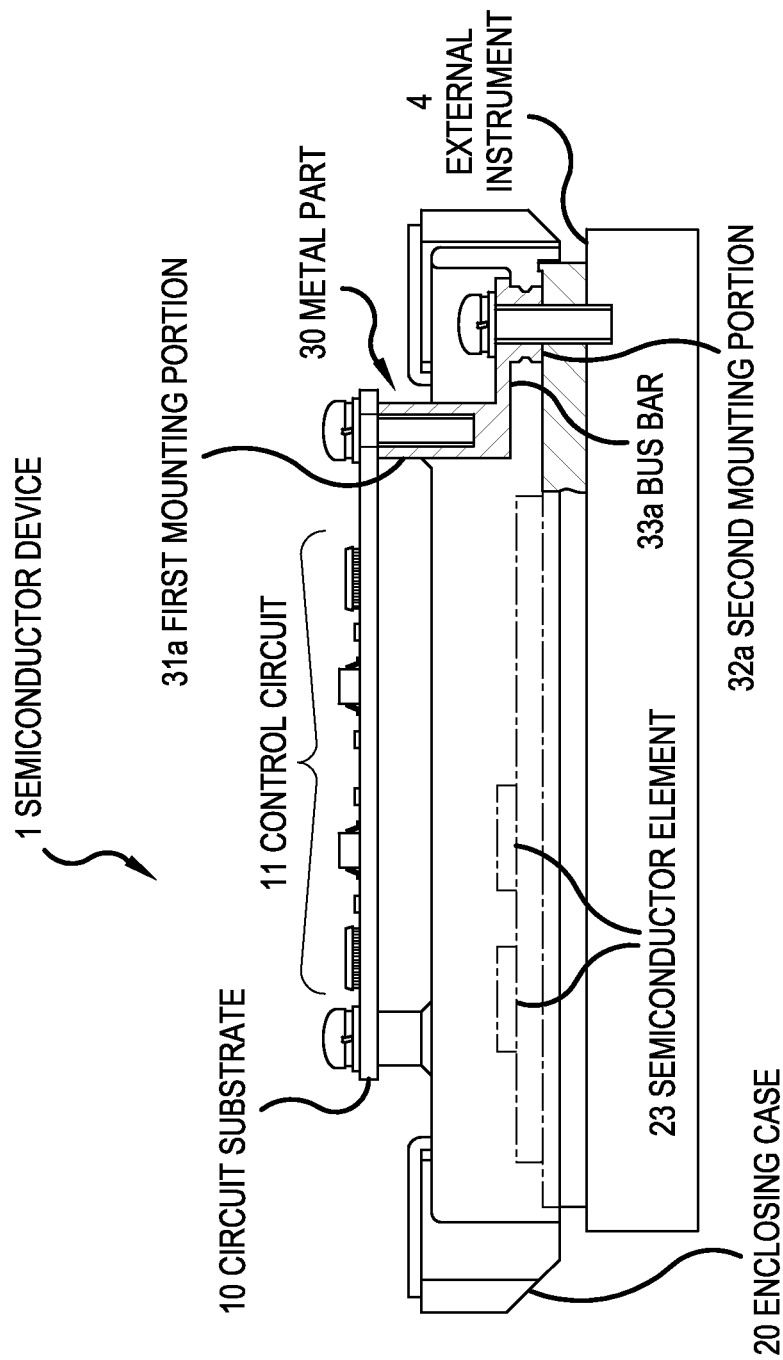
FIG. 1 is a diagram showing a configuration example of a semiconductor device according to an embodiment of the invention.

Hereafter, a description will be given, referring to the drawings, of an embodiment of the invention. FIG. 1 is a diagram showing a configuration example of a semiconductor device according to the embodiment of the invention. Semiconductor device 1 includes circuit substrate 10, enclosing case 20, and metal part 30, and corresponds to, for example, an IPM module.

Control circuit 11 is mounted on the front surface of circuit substrate 10. Enclosing case 20 is a resin case in which semiconductor elements 23 are installed.

Metal part 30, included inside enclosing case 20, includes first mounting portion 31a, second mounting portion 32a, and bus bar 33a. First mounting portion 31a is provided in order to mount circuit substrate 10 on enclosing case 20 and, when mounting, be connected to a ground pattern (hereafter called a GND pattern) of circuit substrate 10.

Also, second mounting portion 32a is provided in order to mount external instrument 4 on enclosing case 20 and be grounded when mounting. For example, a cooling fin or a housing of another device corresponds to external instrument 4. Further, bus bar 33a connects first mounting portion 31a and second mounting portion 32a.

In this way, semiconductor device 1 is configured including metal part 30 including first mounting portion 31a which mounts circuit substrate 10 on enclosing case 20 and is connected to the GND pattern of circuit substrate 10, second mounting portion 32a which mounts external instrument 4 on enclosing case 20 and is grounded when mounting, and bus bar 33a which connects first mounting portion 31a and second mounting portion 32a.

With this kind of configuration, the GND pattern of circuit substrate 10 is electrically connected to the grounded second mounting portion 32a. Because of this, it is possible to efficiently cause noise generated on circuit substrate 10 or noise intruding into circuit substrate 10 to escape from a grounded portion.

By so doing, it is possible to eliminate the need for a review of circuit configurations or an increase of parts to be added afterwards, and thus improve noiseproof performance. A specific configuration of semiconductor device 1 will be described hereafter in or after FIG. 6.

Figure 2:
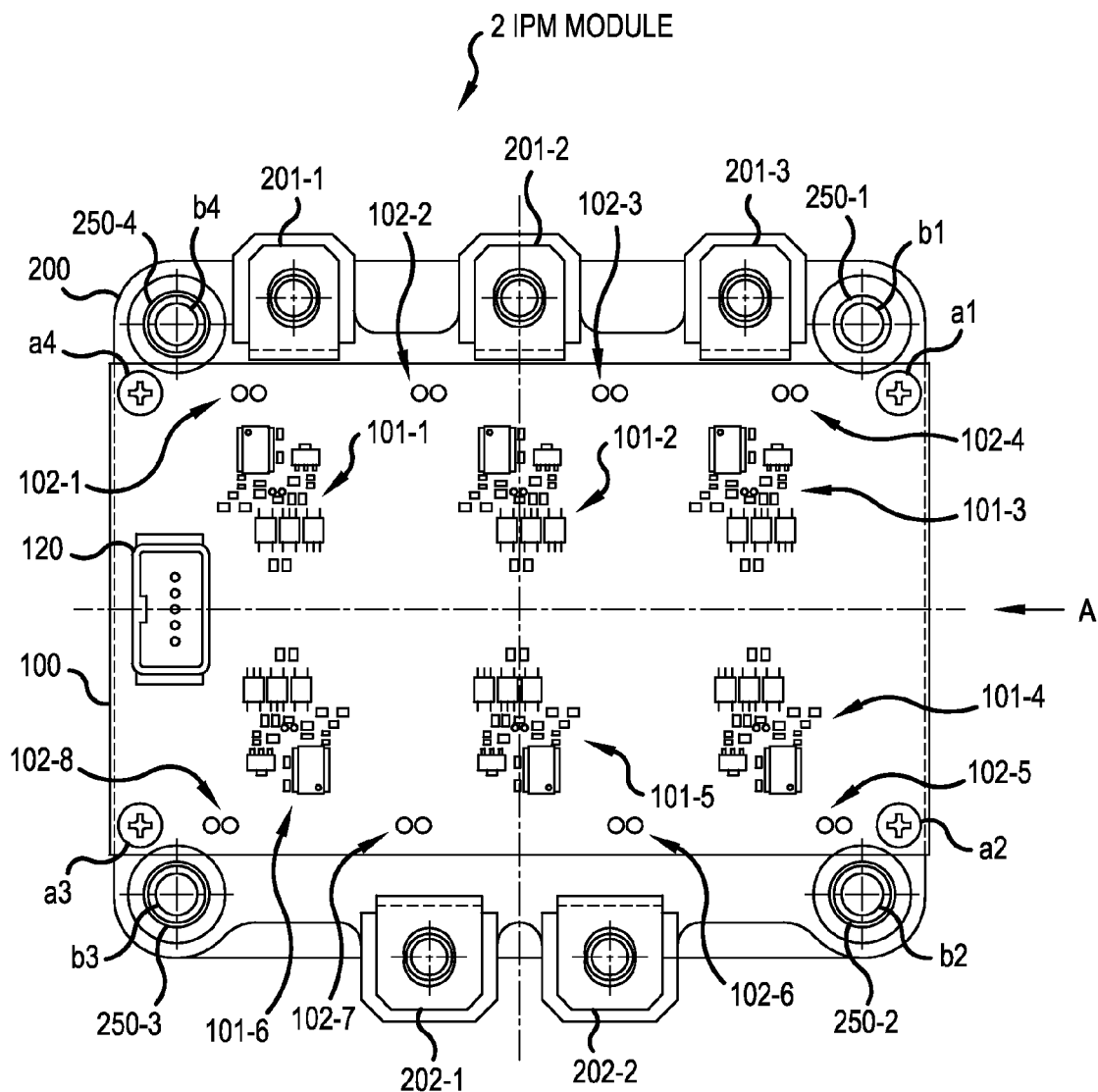
FIG. 2 is a plan view of an IPM module.
Figure 3:
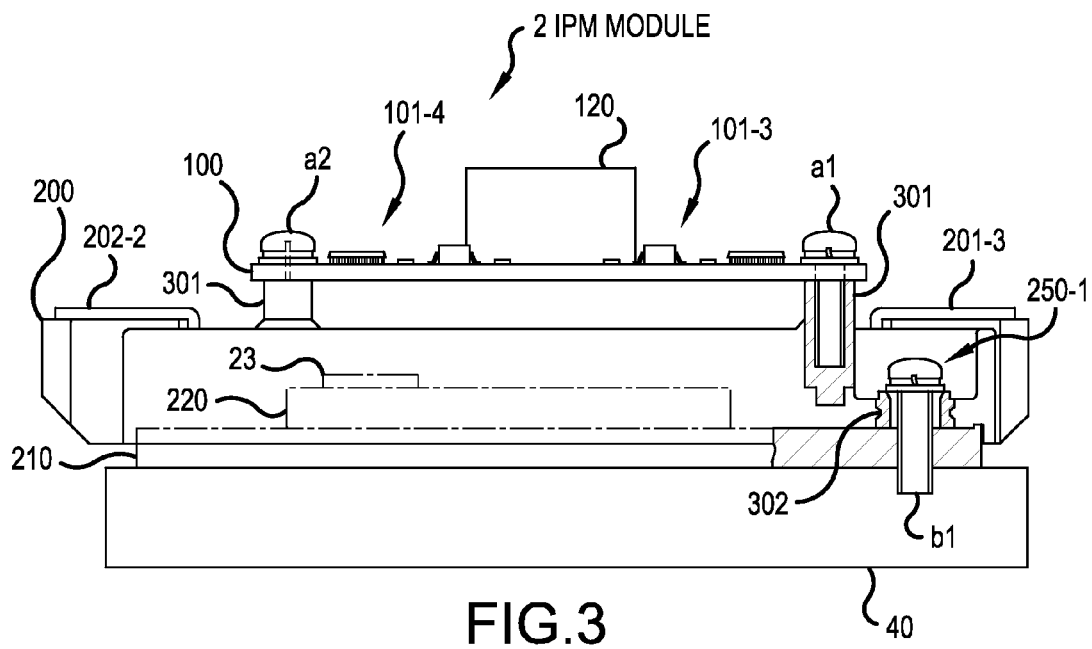
FIG. 3 is a sectional view of the IPM module when seen from the A direction in FIG. 2.

Next, a description will be given of a configuration of a common IPM module. FIG. 2 is a plan view of an IPM module, and FIG. 3 is a sectional view of the IPM module when seen from the A direction in FIG. 2.

IPM module 2 includes circuit substrate 100 and enclosing case 200. Also, heat dissipation base plate 210 is positioned in a bottom portion of enclosing case 200, and cooling fin 40 for cooling heat dissipation base plate 210 are provided on the lower surface side of heat dissipation base plate 210.

Insulating substrate 220 on which is laid a circuit pattern or a conductive material is mounted on the upper surface of heat dissipation base plate 210, and semiconductor elements such as IGBTs 23 are mounted on insulating substrate 220 (a portion on which the IGBTs are mounted will be described hereafter in FIG. 4).

Opened screw seats 301 for mounting circuit substrate 100 are provided in enclosing case 200 made from resin. Circuit substrate 100 is mounted on the upper surface of enclosing case 200 with four corners of circuit substrate 100 fastened and fixed to screw seats 301 by screws a1 to a4 (FIG. 3 shows a condition in which screws a1 and a2 are fastened in screw seats 301).

Also, control circuits 101-1 to 101-6, each configured of circuit elements such as an IC (Integrated Circuit), an LSI (Large Scale Integration), a transistor, a resistor, and a capacitor, are mounted on the front surface of circuit substrate 100.

Furthermore, connector 120, into which an external connection cable is inserted, and control terminals 102-1 to 102-8 are mounted on the front surface of circuit substrate 100.

Control terminals 102-1 to 102-8 are relay terminals which connect the gate wires of IGBTs 23 installed in enclosing case 200 and control circuits 101-1 to 101-6, and carry out the switching controls of IGBTs 23 in accordance with control signals transmitted from control circuits 101-1 to 101-6.

Meanwhile, main terminal (U) 201-1, main terminal (V) 201-2, and main terminal (W) 201-3 are provided on one edge of the frame portion of enclosing case 200, and a power supply terminal (P) 202-1 and power supply terminal (N) 202-2 are provided on another edge of the frame portion.

Main terminal (U) 201-1, main terminal (V) 201-2, and main terminal (W) 201-3 are terminals for driving an external motor in accordance with the switching controls of IGBTs 23. Power supply terminal (P) 202-1 and power supply terminal (N) 202-2 are terminals to which power is supplied from the exterior.

Also, opening portions 250-1 to 250-4 are provided in four corners of the frame of enclosing case 200, and enclosing case 200 and cooling fin 40 are connected by screws b1 to b4 being inserted and fastened into opening portions 250-1 to 250-4 respectively.

Herein, ring portions 302 are provided in portions of opening portions 250-1 to 250-4 in the frame portion of enclosing case 200. Ring portions 302 connect enclosing case 200 and heat dissipation base plate 210. Further, the screws b1 to b4 are inserted in ring portions 302, and enclosing case 200 and cooling fin 40 are fastened and fixed across heat dissipation base plate 210 (FIG. 3 shows only the portion in which is fastened ring portion 302 provided in opening portion 250-1).

Figure 4:
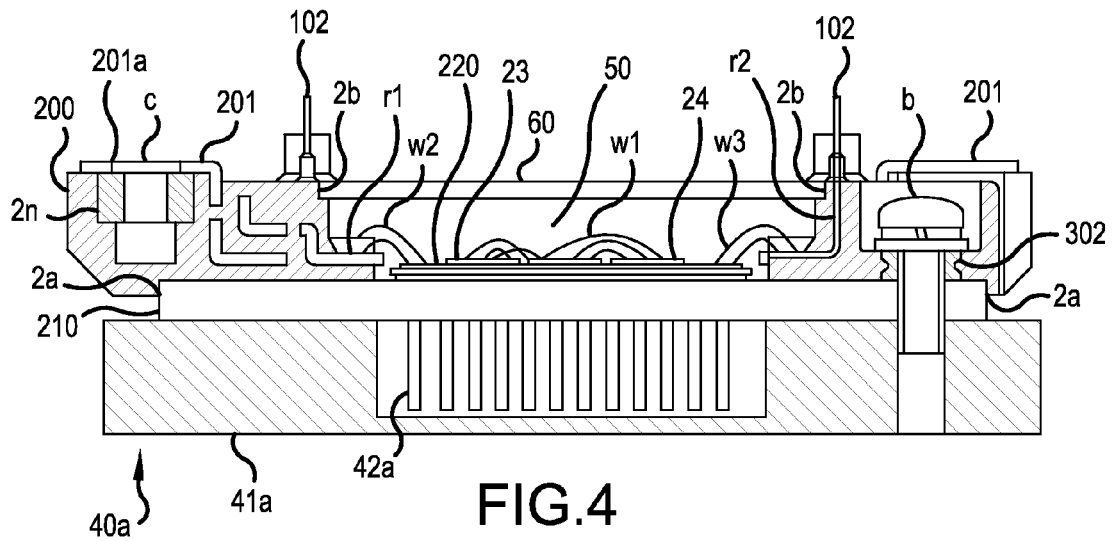
FIG. 4 is a sectional view of an enclosing case and a cooling fin.

FIG. 4 is a sectional view of the enclosing case and the cooling fin. FIG. 4 shows a structure inside enclosing case 200 in a condition in which circuit substrate 100 is not mounted on enclosing case 200, and an internal structure of water-cooling type cooling fin 40a.

Heat dissipation base plate 210 which closes the opening of enclosing case 200 by being fixed to an opening shouldered surface 2a by an adhesive is provided on the bottom surface of enclosing case 200. Also, insulating substrate 220 on which is laid the circuit pattern or conductive material is mounted on the upper surface of heat dissipation base plate 210.

Chips, such as IGBTs 23 and FWDs 24 (Free Wheeling Diodes) which are diodes for commutating a load current, are mounted on insulating substrate 220.

A plurality of IGBTs 23 and FWDs 24 are mutually connected to each other by bonding wires w1. Furthermore, lead terminals r1 and r2 are embedded in the frame portion of enclosing case 200 by insert molding, and connected to IGBTs 23 by bonding wires w2 and w3.

The data wires of IGBTs 23 are connected to the lead terminals r1 via the bonding wires w2, and the lead terminals r1 are connected to main terminals 201 for use in driving the motor. Also, the gate wires of IGBTs 23 are connected to the lead terminals r2 via the bonding wires w3, and the lead terminals r2 are connected to control terminals 102.

Opening holes 201a are provided in main terminals 201. By screws c being inserted into opening holes 201a and fastened into nuts 2n formed in enclosing case 200, main terminals 201 are installed on the front surface of enclosing case 200 in a condition in which main terminals 201 are bent.

Also, the internal space of enclosing case 200 is filled with seal material 50 of gel resin (for example, silicone resin). Also, cover plate 60 made from insulating resin, by being fixed to opening shouldered surface 2b of enclosing case 200 by an adhesive, closes the opening portion.

Meanwhile, the screws b are inserted into ring portions 302 insert molded in the frame portion of enclosing case 200, and enclosing case 200 and cooling fin 40a are fastened and fixed.

Cooling fins 40a are illustrated as water-cooling type cooling fin, and in the case of the water-cooling type, a plurality of fins 42a are provided in water jacket 41a. The heretofore described cooling fin 40a is taken to be of water-cooling type, but may be of air-cooling type.

Figure 5A:
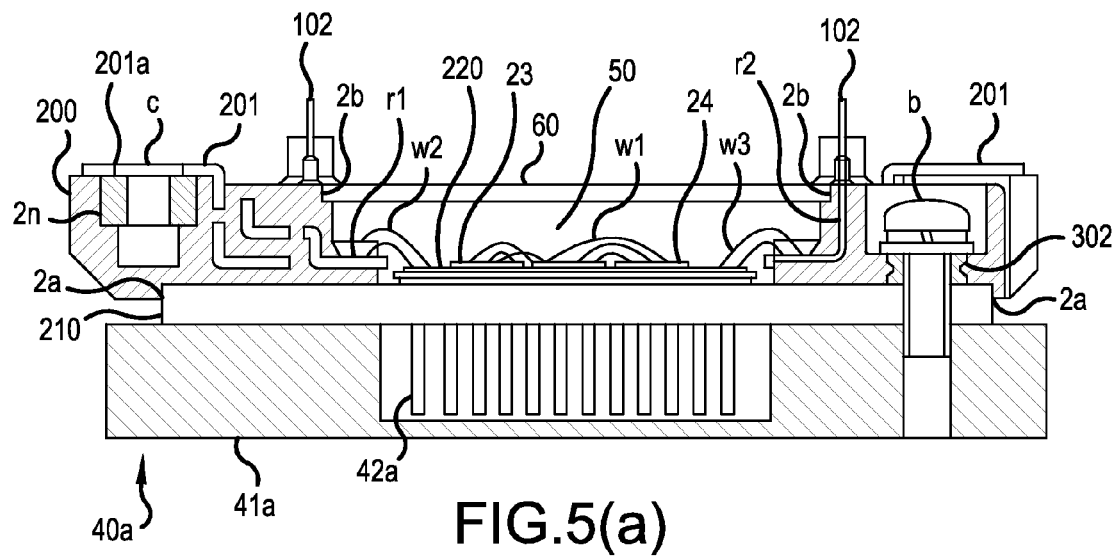
FIGS. 5(a) and 5(b) are diagrams showing a configuration of the cooling fin.
Figure 5B:
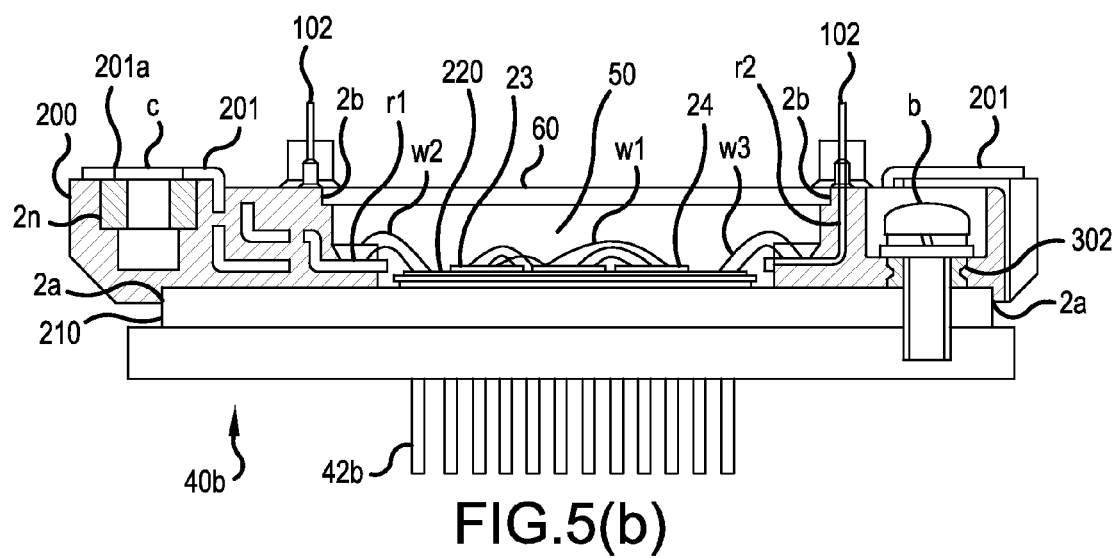

FIG. 5 shows a configuration of cooling fin. (a) is a water-cooling type cooling fin 40a, and (b) is an air-cooling type cooling fin 40b. In the case of the air-cooling type, fins 42b have a structure wherein they are exposed directly to air. Cooling fin mounted on enclosing case 200 may be of either water-cooling type or air-cooling type.

Herein, with the heretofore described kind of configuration of the heretofore known IPM module 2, a pattern design for anti-noise measures has been carried out, or a noise suppression part such as a bypass capacitor or a shield plate has been added, in order to remove noise generated on circuit substrate 100 or noise intruding into circuit substrate 100 through connector 120.

However, as it is necessary to review circuit configurations when carrying out a pattern design for anti-noise measures, an increase in the number of man-hours for development occurs, and when adding a noise suppression part such as a bypass capacitor or a shield plate, an increase in mounting/circuit size and cost occurs.

The present technology, having been designed bearing in mind these kinds of points, provides a semiconductor device wherein the need for a review of circuit configurations and an increase of parts to be added afterwards is eliminated, thus improving noiseproof performance, and a manufacturing method of the semiconductor device.

Figure 6:
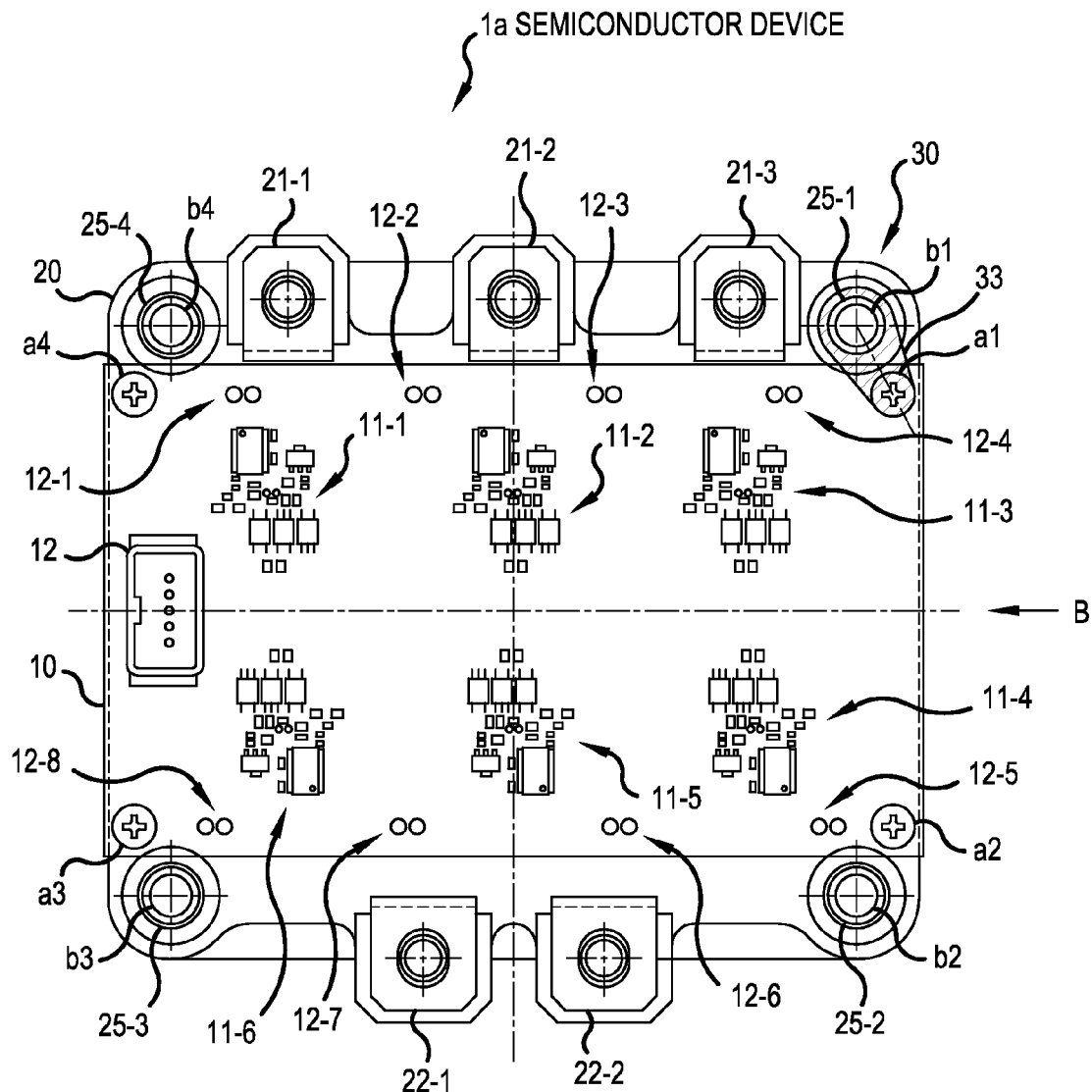
FIG. 6 is a plan view of the semiconductor device according to the embodiment of the invention.
Figure 7:
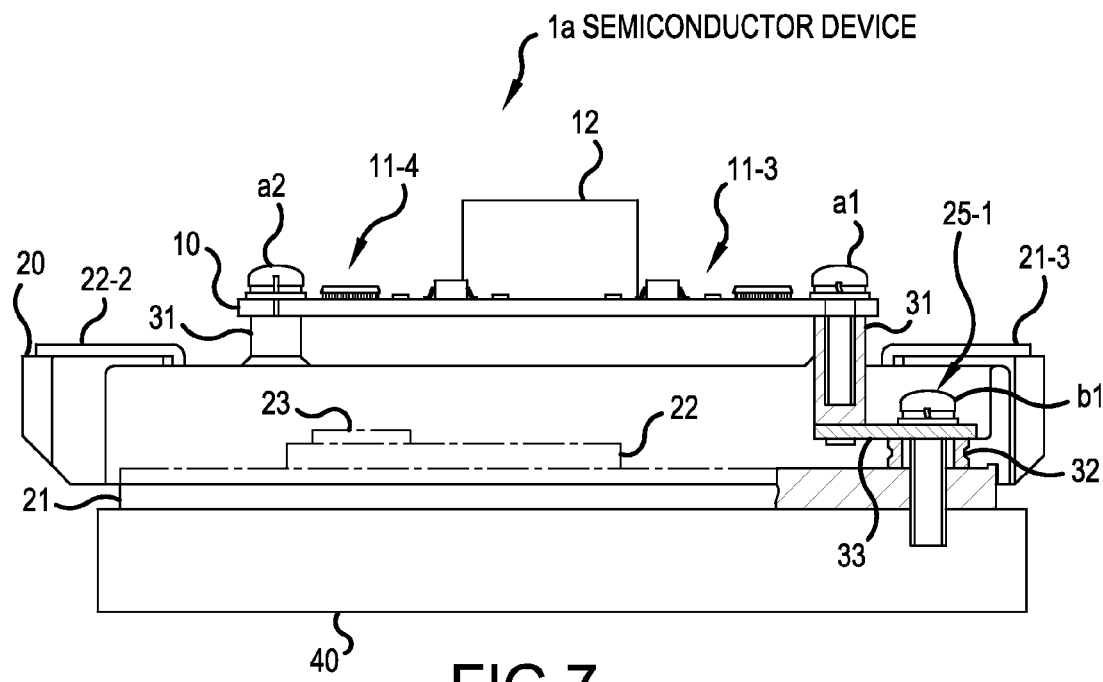
FIG. 7 is a fragmentary sectional view showing a main portion of the semiconductor device when seen from the B direction in FIG. 6.

Next, a detailed description will be given, as one example of the semiconductor device of the present technology, of a configuration when the semiconductor device of the present technology is applied to the heretofore described IPM module 2. FIG. 6 is a plan view of a semiconductor device according to the embodiment of the invention, and FIG. 7 is a fragmentary sectional view showing a main portion of the semiconductor device when seen from the B direction in FIG. 6.

Semiconductor device 1a includes circuit substrate 10 and enclosing case 20. Also, heat dissipation base plate 21 is positioned in a bottom portion of enclosing case 20, and cooling fin 40 (which may be of either water-cooling type or air-cooling type) for cooling heat dissipation base plate 21 are provided on the lower surface side of heat dissipation base plate 21.

Insulating substrate 22 on which is laid a circuit pattern or a conductive material is mounted on the upper surface of heat dissipation base plate 21, and semiconductor elements such as IGBTs 23 are mounted on insulating substrate 22 (as a portion on which are mounted semiconductor elements such as IGBTs is of the same basic configuration as that in the heretofore described FIG. 4, a description will be omitted).

Metal columnar supports 31 for mounting circuit substrate 10 are provided in enclosing case 20 made from resin. Circuit substrate 10, by four corners thereof being fastened to metal columnar supports 31 by screws a1 to a4 (corresponding to a first screw), is mounted on the upper surface of enclosing case 20 (FIG. 7 shows a condition in which the screws a1 and a2 are fastened in metal columnar supports 31).

Also, control circuits 11-1 to 11-6, each configured of circuit elements such as an IC, an LSI, a transistor, a resistor, and a capacitor, are mounted on the front surface of circuit substrate 10.

Furthermore, connector 12, into which an external connection cable is inserted, and control terminals 12-1 to 12-8 are mounted on the front surface of circuit substrate 10.

Control terminals 12-1 to 12-8 are relay terminals which connect the gate wires of IGBTs 23 installed in enclosing case 20 and control circuits 11-1 to 11-6, and carry out the switching controls of IGBTs 23 in accordance with control signals transmitted from control circuits 11-1 to 11-6.

Meanwhile, main terminal (U) 21-1, main terminal (V) 21-2, and main terminal (W) 21-3 are provided on one edge of the frame portion of enclosing case 20, and power supply terminal (P) 22-1 and power supply terminal (N) 22-2 are provided on another edge of the frame portion.

Main terminal (U) 21-1, main terminal (V) 21-2, and main terminal (W) 21-3 are terminals for driving an external motor in accordance with the switching controls of IGBTs 23. Power supply terminal (P) 22-1 and power supply terminal (N) 22-2 are terminals to which power is supplied from the exterior.

Also, opening portions 25-1 to 25-4 are provided in four corners of the frame of enclosing case 20, and enclosing case 20 and cooling fin 40 are fastened and fixed by the screws b1 to b4 (corresponding to a second screw) being inserted and fastened into opening portions 25-1 to 25-4 (FIG. 7 shows only a portion to which is fastened ring portion 32 provided in opening portion 25-1).

Next, a description will be given of metal part 30. In FIG. 6, metal part 30 is provided in upper right opening portion 25-1 in one of the four corners of the frame of enclosing case 20. This is one example, and metal part 30 may be provided in one of other opening portions 25-2 to 25-4, or one place not being limiting, metal parts 30 may be provided in a plurality of places.

In FIG. 7, metal part 30 includes metal columnar support 31, ring portion 32, and metal bus bar 33. Metal columnar support 31 forms a screw seat for fastening, fixing, and mounting circuit substrate 10 to enclosing case 20 using the screw a1, and by the screw a1 being inserted into metal columnar support 31, circuit substrate 10 is fastened and fixed to enclosing case 20. Also, when circuit substrate 10 is mounted on enclosing case 20, metal columnar support 31 is connected to a GND pattern on the rear surface of circuit substrate 10.

Ring portion 32 connects heat dissipation base plate 21 included in enclosing case 20 and enclosing case 20. Also, ring portion 32 forms a screw seat for fastening, fixing, and mounting cooling fin 40 to enclosing case 20 using the screw b1, and by the screw b1 being inserted into ring portion 32, cooling fin 40 are fastened and fixed to enclosing case 20.

Furthermore, ring portion 32 is grounded through the screw b1 protruding outside enclosing case 20. Metal bus bar 33 connects metal columnar support 31 and ring portion 32.

Herein, as the screw b1 protruding outside enclosing case 20 fastens and fixes enclosing case 20 and cooling fin 40, a portion of the screw b1 protruding from enclosing case 20 is connected to a metal surface (chassis) of cooling fin 40.

Further, the GND pattern of circuit substrate 10 is connected to metal columnar support 31, ring portion 32 is connected to the metal surface of cooling fin 40 via the screw b1, and furthermore, metal bus bar 33 connects metal columnar support 31 and ring portion 32.

Consequently, the GND pattern of circuit substrate 10 is electrically connected to the metal surface of cooling fin 40 via metal columnar support 31, metal bus bar 33, and ring portion 32. As the metal surface of cooling fin 40 is grounded to a reference ground plane, the GND pattern of circuit substrate 10 is grounded to the reference ground plane through the metal surface of cooling fin 40.

According to this kind of configuration of semiconductor device 1a, it is possible to efficiently release noise generated on circuit substrate 10, or noise intruding into circuit substrate 10, to the reference ground plane. Because of this, it is possible to eliminate the need for a review of circuit configurations or an increase of parts to be added afterwards, and thus improve noiseproof performance.

There is, for example, a case in which an insulator such as a silicon compound is inserted between heat dissipation base plate 21 and cooling fin 40 in order to enhance a cooling effect.

In this case, the surface of mutual contact between heat dissipation base plate 21 and cooling fin 40 is electrically insulated. However, the present technology adopts a structure wherein by the screw b1 being inserted into the metal of cooling fin 40, enclosing case 20 and cooling fin 40 are installed fixed together across heat dissipation base plate 21. Consequently, metal part 30 is electrically connected via the screw b1, and is not insulated by a silicon compound or the like.

Because of this, with semiconductor device 1a, there is no problem even when an insulator such as a silicon compound is inserted between heat dissipation base plate 21 and cooling fin 40. Consequently, with semiconductor device 1a too, it is possible to increase heat conductivity and enhance the cooling effect by inserting an insulator such as a silicon compound and thus causing heat dissipation base plate 21 and cooling fin 40 to be more closely attached together.

In the above description, cooling fin 40 has been used as external instrument 4, but a housing of another device may be used as external instrument 4. In this case, by enclosing case 20 and housing being fastened and fixed by the screw b1 protruding outside enclosing case 20, the GND pattern of circuit substrate 10 is electrically connected to the metal surface of the housing via metal part 30, and it is possible to obtain the same advantageous effects as heretofore described.

Figure 8:
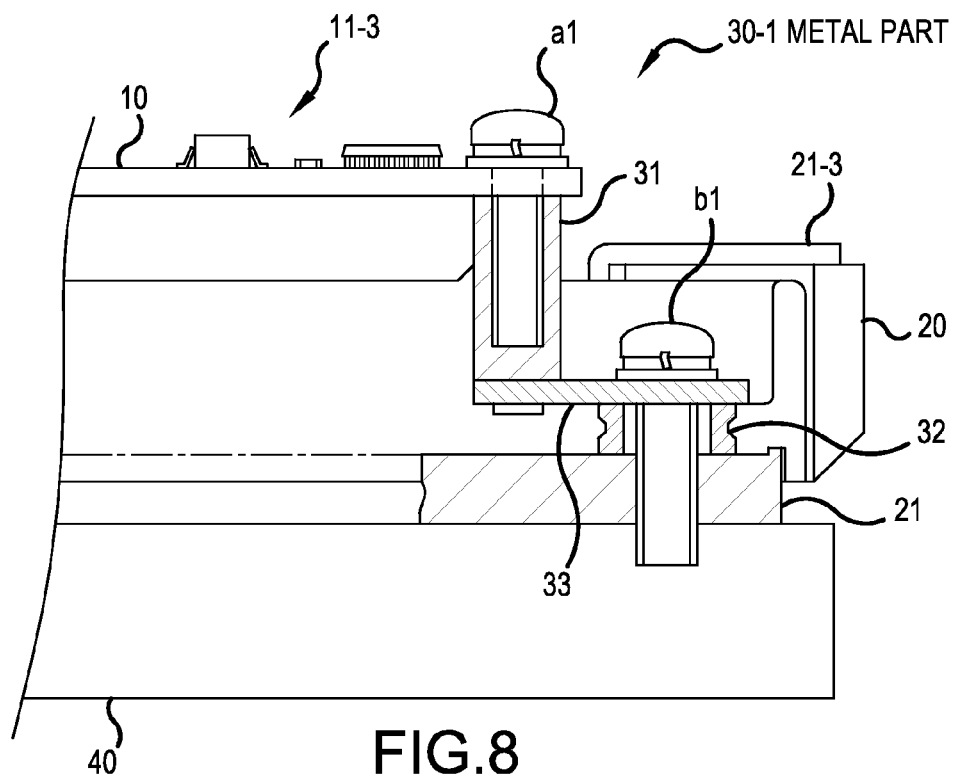
FIG. 8 is a diagram showing a configuration of a metal part.

Next, a description will be given of combination patterns of parts configuring metal part 30. FIG. 8 is a diagram showing a configuration of a metal part. Metal part 30-1 includes three parts, metal columnar support 31, ring portion 32, and metal bus bar 33.

One end of metal bus bar 33 is fixed to a protruding portion provided at the leading end of metal columnar support 31. Also, the other end of metal bus bar 33 is fastened and fixed to ring portion 32 by the screw b1.

In the above description, it has been taken that the one end of metal bus bar 33 is fixed to the protruding portion provided at the leading end of metal columnar support 31, but another joining method may be used.

For example, it is also possible to adopt an arrangement such as to fit metal bus bar 33 into a depressed portion of metal columnar support 31 or expand the hole diameter of metal bus bar 33 and fit metal bus bar 33 around a barrel portion of metal columnar support 31. Furthermore, the screw a1 may be caused to pass through the bottom surface of metal columnar support 31, thus fixing the one end of metal bus bar 33 to metal columnar support 31 using a portion of the screw a1 passing through.

Figure 9:
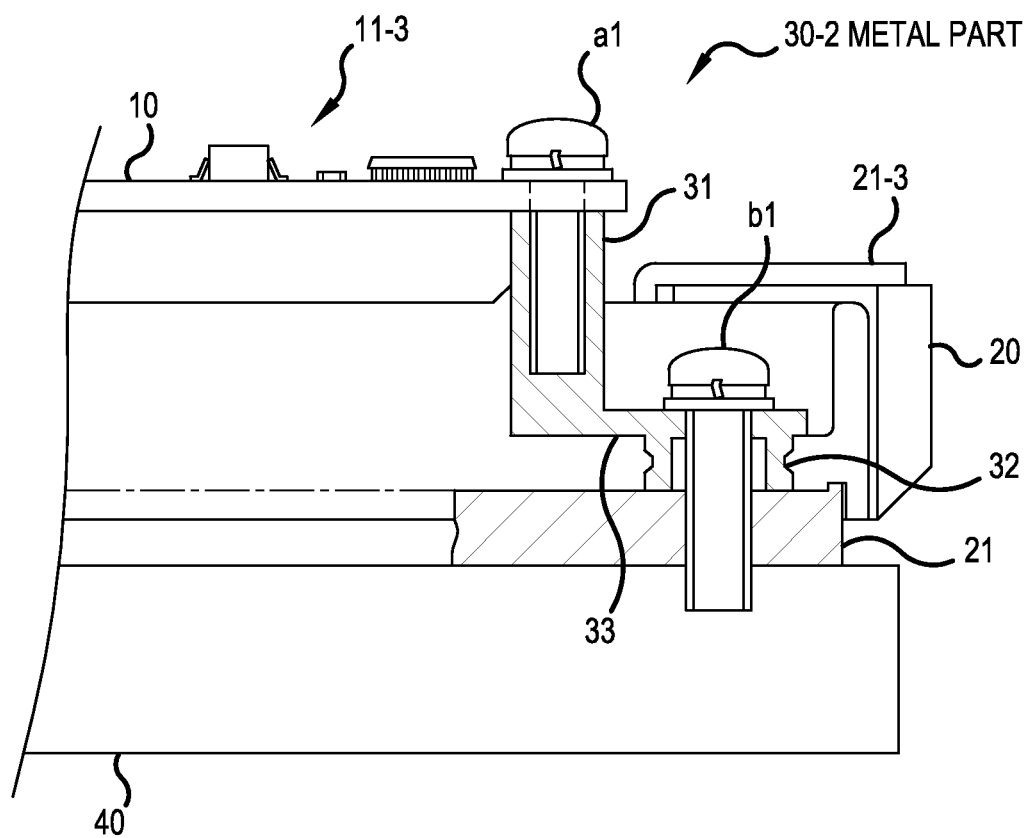
FIG. 9 is a diagram showing another configuration of the metal part.
Figure 10:
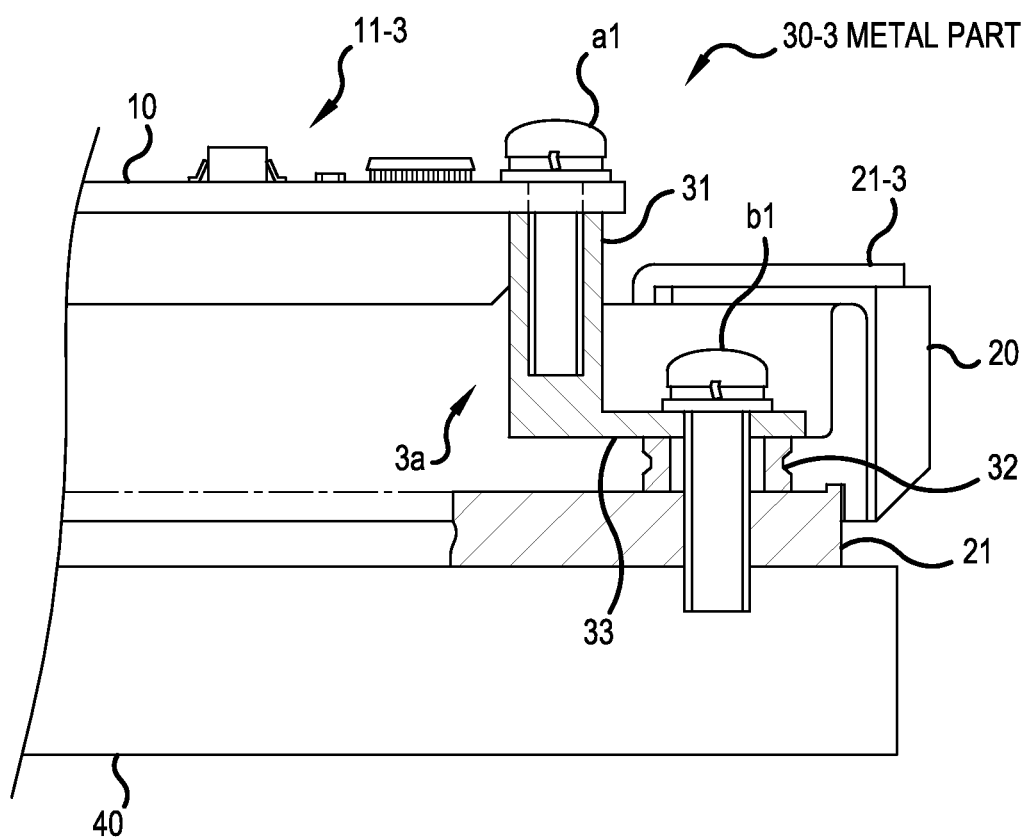
FIG. 10 is a diagram showing another configuration of the metal part.
Figure 11:
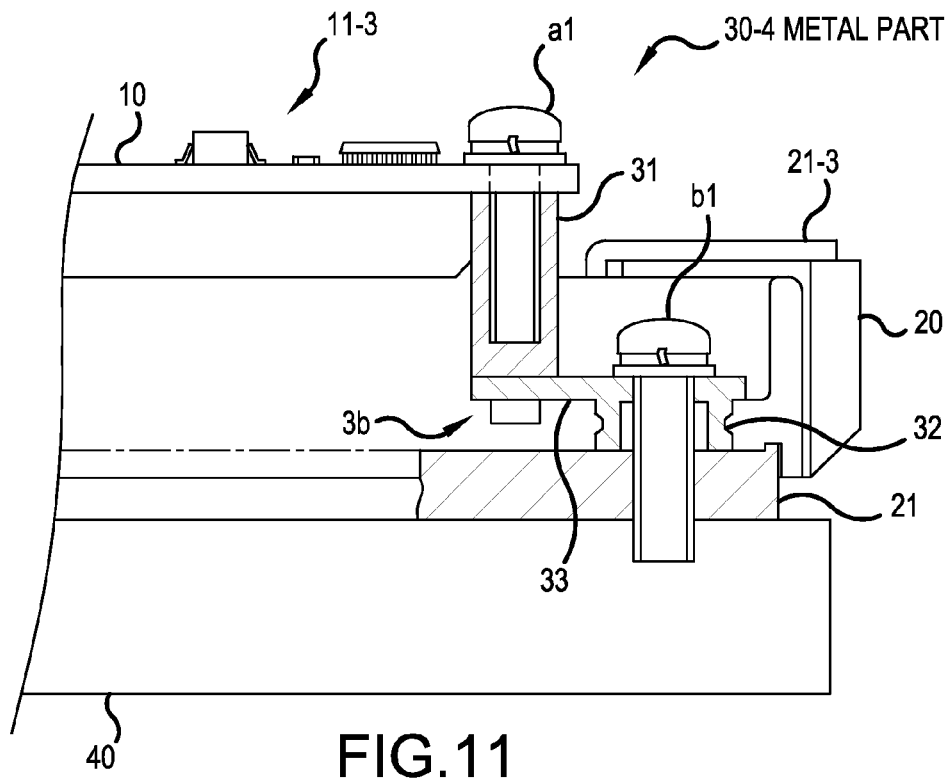
FIG. 11 is a diagram showing another configuration of the metal part.

FIGS. 9 to 11 are diagrams showing other configurations of the metal part. Metal part 30-2 shown in FIG. 9 is one part into which metal columnar support 31, ring portion 32, and metal bus bar 33 are integrally molded. In this way, a configuration may be adopted wherein the individual parts are integrally molded.

Also, metal part 30-3 shown in FIG. 10 includes part 3a, into which metal columnar support 31 and metal bus bar 33 are integrally molded, and ring portion 32. In this case, one end of metal bus bar 33 of part 3a is fastened and fixed to ring portion 32 by the screw b1.

Furthermore, metal part 30-4 shown in FIG. 11 includes part 3b, into which ring portion 32 and metal bus bar 33 are integrally molded, and metal columnar support 31. In this case, one end of metal bus bar 33 of part 3b is fastened and fixed to metal columnar support 31 by the screw a1.

In this way, metal part 30 may be configured using either the part into which metal columnar support 31 and metal bus bar 33 are integrally molded or the part into which ring portion 32 and metal bus bar 33 are integrally molded. Metal part 30 is fixed to enclosing case 20 by integral molding such as insert molding.

Figure 12:
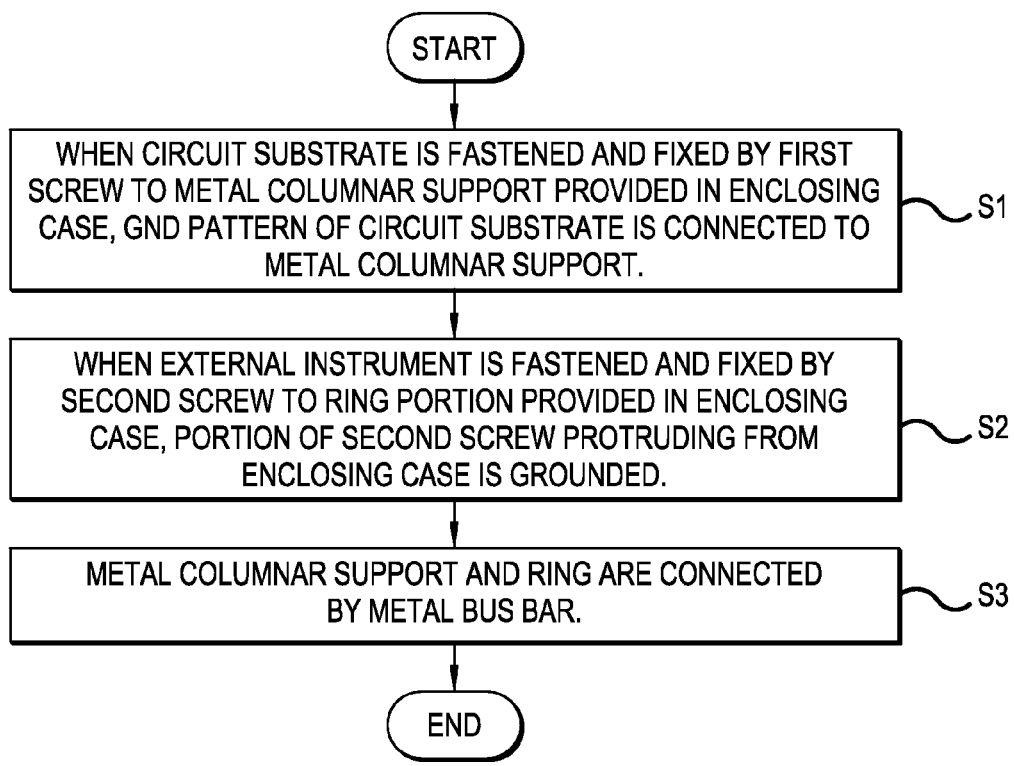
FIG. 12 is a diagram showing a flowchart of a semiconductor device manufacturing method according to the embodiment of the invention.

Next, a description will be given of a flow of a semiconductor device manufacturing method. FIG. 12 is a diagram showing a flowchart of a semiconductor device manufacturing method according to the embodiment of the invention.

[S1] When the circuit substrate on which the control circuit is mounted is fastened and fixed by the first screw to the metal columnar support provided in the enclosing case in which the semiconductor elements are installed, the GND pattern of the circuit substrate is connected to the metal columnar support.

[S2] When the external instrument is fastened and fixed by the second screw to the ring portions provided in the enclosing case, the protruding portion of the second screw which protrudes outside from the enclosing case is grounded.

[S3] The metal columnar support and ring portion are connected by the metal bus bar.

As heretofore described, semiconductor device 1 is configured including the metal part including the first mounting portion which mounts the circuit substrate on the enclosing case and is connected to the ground pattern of the circuit substrate, the second mounting portion which mounts the external instrument on the enclosing case and is grounded, and the bus bar which connects the first and second mounting portions to each other.

By so doing, it is possible to eliminate the need for a review of circuit configurations or an increase of parts to be added afterwards, and thus improve noiseproof performance.

Also, as the GND pattern of the circuit substrate is connected by the shortest path to a reference GND (the reference ground plane) via the metal part, it is possible to drastically reduce wiring inductors, and thus improve noiseproof performance. Furthermore, it is possible to respond to a test for endurance against noise signals of up to a high frequency band.

Still furthermore, the semiconductor device manufacturing method is such that when the circuit substrate is fastened and fixed by the screw to the metal columnar support provided in the enclosing case, the ground pattern of the circuit substrate is connected to the metal columnar support. Also, when the external instrument is fastened and fixed by the screw to the ring portion provided in the enclosing case, the screw is protruded outside and grounded. Further, the metal columnar support and ring portion are connected by the metal bus bar, thus manufacturing the semiconductor device.

By so doing, it is possible to eliminate the need for a review of circuit configurations or an increase of parts to be added afterwards, and thus improve noiseproof performance. Also, as the GND pattern of the circuit substrate is connected by the shortest path to the reference GND (reference ground plane) via the metal part, it is possible to drastically reduce wiring inductors and thus improve noiseproof performance. Furthermore, it is also possible to respond to a test for endurance against noise signals of up to a high frequency band.

The embodiment has heretofore been illustrated by example, but it is possible to replace the configurations of the individual parts shown in the embodiment with those of other parts having the same functions. Also, any other component and step may be added.

The above description simply illustrates the principle of the invention. Furthermore, a great number of modifications and alterations are possible for those skilled in the art, and the invention not being limited to the heretofore illustrated and described exact configurations and applications, all corresponding modification examples and equivalents are deemed to be within the scope of the invention defined by the attached claims and the equivalents thereof.

Thus, a semiconductor device and method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

REFERENCE SIGNS LIST

1 Semiconductor device
10 Circuit substrate
11 Control circuit
20 Enclosing case
23 Semiconductor element
30 Metal part
31a First mounting portion
32a Second mounting portion
33a Bus bar
4 External instrument

What is claimed is:

1. A semiconductor device, comprising:
an enclosing case in which semiconductor elements are installed;
a circuit substrate on which a control circuit is mounted; and
a metal part, having a first mounting portion which mounts the circuit substrate on the enclosing case and is connected to a ground pattern of the circuit substrate when mounting, and a second mounting portion which mounts an external instrument on the enclosing case and is grounded when mounting, which connects the first mounting portion and second mounting portion, the metal part comprising a bus bar positioned to be parallel to the circuit substrate and having a first end and a second end opposite from the first end, wherein the first mounting portion is positioned on the first end and comprises an opening in which a first screw can be inserted, and the second mounting portion is positioned on the second end and comprises an opening in which a second screw can be inserted.

2. The semiconductor device according to claim 1, wherein the metal part comprises:
a metal columnar support which is the first mounting portion which forms a screw seat for fastening, fixing, and mounting the circuit substrate to the enclosing case with the first screw and is connected to the ground pattern of the circuit substrate;
a metal ring portion which is the second mounting portion which forms a screw seat for fastening, fixing, and mounting the external instrument to the enclosing case with the second screw and is grounded through the second screw protruding outside the enclosing case; and
a metal bus bar which is the bus bar which connects the metal columnar support and ring portion.

3. The semiconductor device according to claim 2, wherein the external instrument is a cooling fin which is fastened and fixed to the enclosing case by the second screw protruding outside the enclosing case, and the ground pattern of the circuit substrate is electrically connected to a metal surface of the cooling fin via the metal part.

4. The semiconductor device according to claim 2, wherein the external instrument is a housing which is fastened and fixed to the enclosing case by the second screw protruding outside the enclosing case, and the ground pattern of the circuit substrate is electrically connected to the metal surface of the housing via the metal part.

5. The semiconductor device according to claim 2, wherein the metal columnar support, ring portion, and metal bus bar are individual parts, and one end of the metal bus bar is fixed to a protruding portion provided at the leading end of the metal columnar support, while the other end of the metal bus bar is fastened and fixed to the ring portion by the second screw.

6. The semiconductor device according to claim 2, wherein the metal columnar support, ring portion, and metal bus bar are integrally molded into one part.

7. The semiconductor device according to claim 2, wherein either the metal columnar support and metal bus bar are integrally molded into one part or the metal bus bar and ring portion are integrally molded into one part.

8. The semiconductor device according to claim 1, wherein a metal component is provided on at least one of the four corners of the enclosing case.

9. The semiconductor device according to claim 1, further comprising a heat dissipation board arranged on a bottom portion of the enclosing case.

10. The semiconductor device according to claim 9, wherein an inside part of the enclosing case includes a ring portion which connects the enclosing case and the heat dissipation board.

11. The semiconductor device according to claim 1, further comprising a heat dissipation board disposed between the enclosing case and the external instrument, the external instrument being fastened to the enclosing case by the second screw inserted in the opening of the second mounting portion.

12. The semiconductor device according to claim 1, wherein the first mounting portion, the second mounting portion, the bus bar, and the external instrument are electrically connected to each other.

13. The semiconductor device according to claim 1, wherein the second screw inserted in the opening of the second mounting portion penetrates a surface of the external instrument.

* * * * *